(12) United States Patent
Zheng et al.

(10) Patent No.: US 10,170,888 B2
(45) Date of Patent: Jan. 1, 2019

(54) DUAL-USE LASER SOURCE COMPRISING A CASCADED ARRAY OF HYBRID DISTRIBUTED FEEDBACK LASERS

(71) Applicant: Oracle International Corporation, Redwood Shores, CA (US)

(72) Inventors: Xuezhe Zheng, San Diego, CA (US); Ying Luo, San Diego, CA (US); Ashok V. Krishnamoorthy, San Diego, CA (US); Kannan Raj, San Diego, CA (US)

(73) Assignee: Oracle International Corporation, Redwood Shore, CA (US)

( * ) Notice: Subject to any disclaimer, the term of this patent is extended or adjusted under 35 U.S.C. 154(b) by 176 days.

(21) Appl. No.: 15/343,080

(22) Filed: Nov. 3, 2016

(65) Prior Publication Data

US 2018/0231807 A1 Aug. 16, 2018

Related U.S. Application Data

(60) Provisional application No. 62/367,243, filed on Jul. 27, 2016.

(51) Int. Cl.
| | |
|---|---|
| *H01S 5/12* | (2006.01) |
| *G02F 1/025* | (2006.01) |
| *H04J 14/02* | (2006.01) |
| *H01S 5/40* | (2006.01) |
| *H01S 5/125* | (2006.01) |
| *H04B 10/50* | (2013.01) |

(52) U.S. Cl.
CPC ............ *H01S 5/1228* (2013.01); *G02F 1/025* (2013.01); *H01S 5/125* (2013.01); *H01S 5/4025* (2013.01); *H04B 10/506* (2013.01); *H04J 14/02* (2013.01)

(58) Field of Classification Search
CPC ...... H01S 5/1228; H01S 5/125; H01S 5/1209; H01S 5/4025; G02F 1/025; H04B 10/506; H04J 14/02
See application file for complete search history.

(56) References Cited

U.S. PATENT DOCUMENTS 8,204,385 B2 6/2012 Zheng et al.

OTHER PUBLICATIONS

H. Sanjoh et al: "Multiwavelength light source with precise frequency spacing using a mode-locked semiconductor laser and an arrayed waveguide grating filter" IEEE Photon. Technol. Lett., 9 (6), 818-820, Jun. 1997.

(Continued)

*Primary Examiner* — Armando Rodriguez
(74) *Attorney, Agent, or Firm* — Park, Vaughan, Fleming & Dowler LLP

(57) ABSTRACT

The disclosed embodiments provide a laser source comprising a silicon waveguide formed in a silicon layer, and a cascaded array of hybrid distributed feedback (DFB) lasers formed by locating sections of III-V gain material over the silicon waveguide. Each DFB laser in the cascaded array comprises a section of III-V gain material located over the silicon waveguide, wherein the section of III-V gain material includes an active region that generates light, and a Bragg grating located between the III-V gain material and the silicon waveguide. This Bragg grating has a resonance frequency within a gain bandwidth of the section of III-V material and is transparent to frequencies that differ from the resonance frequency. Moreover, each DFB laser has a hybrid mode that resides partially in the III-V gain material and partially in silicon.

20 Claims, 6 Drawing Sheets

(56) References Cited

OTHER PUBLICATIONS

P.J. Delfyett et al: "Optical frequency combs from semiconductor lasers and applications in ultrawideband signal processing and communications" J.Lightwave Technol., 24(7) 2701-2719, Jul. 2006.
R.P. Scott et al: "3.5-THz wide, 175 mode optical comb source" OFC/NFOEC, OWJ3, pp. 1-3, 2007.
A. Kovsh et al: "Quantum dot laser with 75nm broad spectrum of emission" Opt. Lett., 32, 793, Apr. 1, 2007.
Gegory L. Wojcik et al: "A single comb laser source for shor reach WDM interconnects", Proceedings of the SPIE, vol. 7230, pp. 72300M-72300M-12, Feb. 2009. Downloaded from researchgate.net on Dec. 29, 2016. https://www.researchgate.net/publications/253511474_A_single_comb_laser_source_for_short_reach_WDM_Interconnects.
K. Kato et al: "32×32 full-mesh (1024 path) wavelength routing WDM network based on uniform loss cyclic-frequency arrayed-waveguide grating" Electron. Lett, vol. 36, pp. 1294-1295, May 22, 2000.
D. Jiang et al: "A novel distributed feedback fiber laser based on equivalent phase shift" IEEE Photo. Tech. Lett. 16(12) 2598-2600, Dec. 2004.
Y. Shi et al: "Experimental demonstration of eight-wavelength distributed feedback semiconductor laser array using equivalent phase shift" Opt. Lett., 37(16) 3315-3317, Aug. 15, 2012.
J.E. Bowers et al: "Hybrid Silicon Evanescent Laser in a Silicon-on-Insulator Waveguide" OFC2007, OTuK4, 2006.

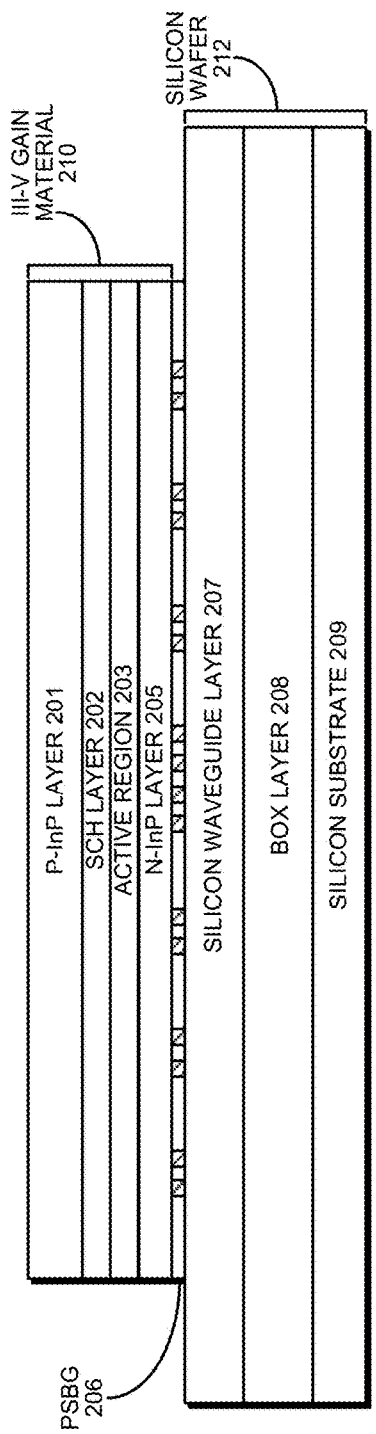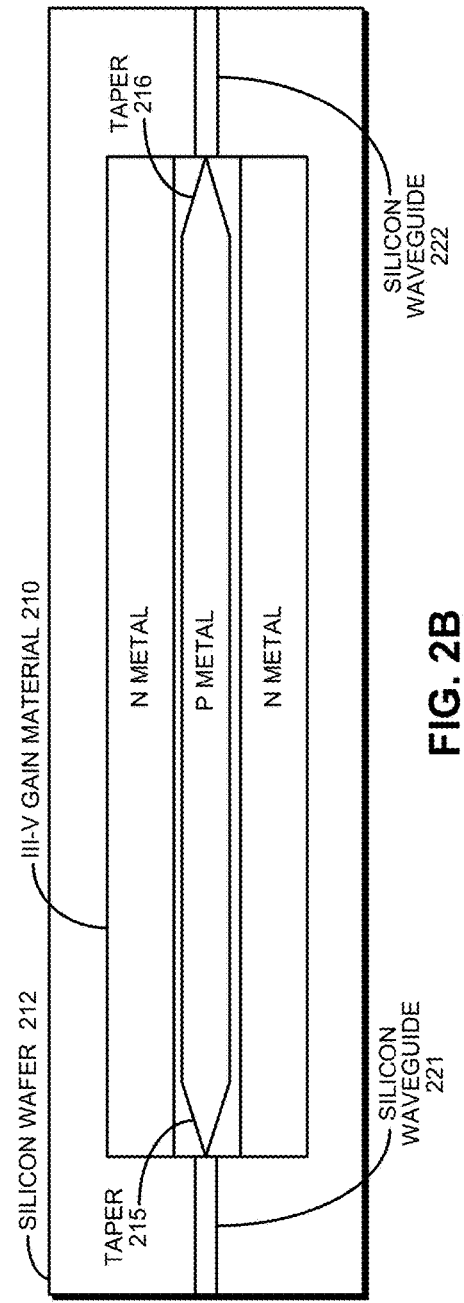
FIG. 2A (SIDE VIEW)
FIG. 2B (TOP VIEW)

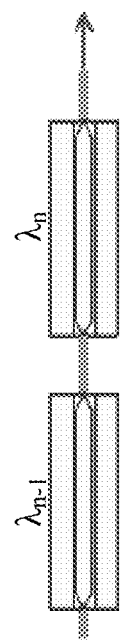
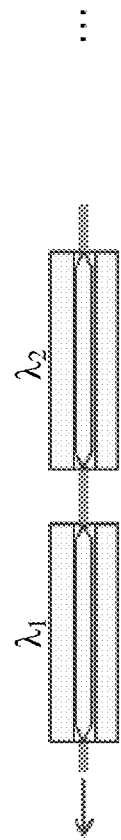
FIG. 3A
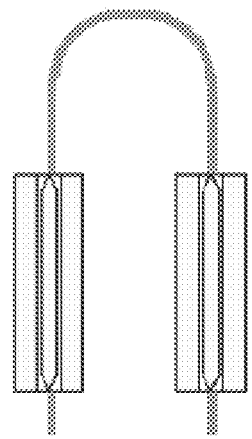
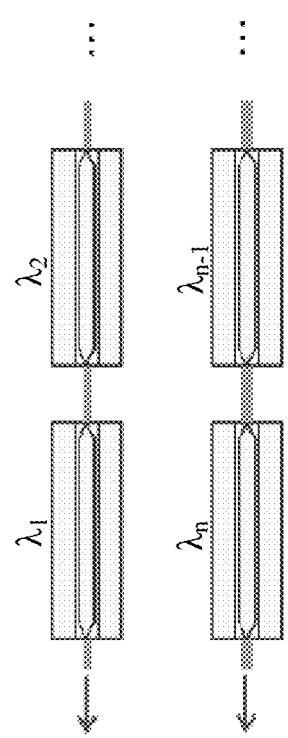
FIG. 3B

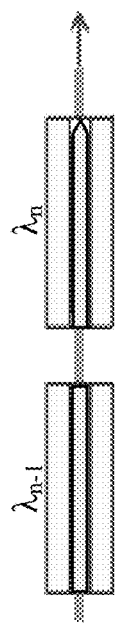
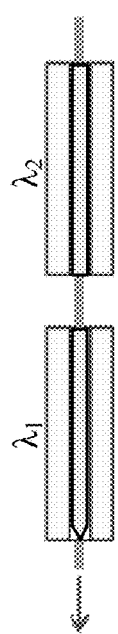
FIG. 3C

DUAL-USE LASER SOURCE COMPRISING A CASCADED ARRAY OF HYBRID DISTRIBUTED FEEDBACK LASERS

RELATED APPLICATION

This application claims priority under 35 U.S.C. § 119 to U.S. Provisional Application No. 62/367,243, entitled "A Dual-Use III-V/Si Hybrid Laser Circuit Using Cascaded Si Phase-Shifted Sampled Bragg Gratings" by the same inventors as the instant application, filed 27 Jul. 2016, the contents of which are incorporated by reference herein in their entirety.

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The disclosed embodiments generally relate to designs for semiconductor-based lasers. More specifically, the disclosed embodiments relate to the design of a dual-use laser source comprising a cascaded array of hybrid distributed feedback lasers.

Related Art

Silicon photonics is a promising new technology that provides large communication bandwidth, low latency and low power consumption for inter-chip and intra-chip optical connections. Silicon photonics also has the potential to provide better scalability and to achieve a large bandwidth density by using wavelength division multiplexing (WDM). However, in order to provide complete silicon photonic WDM links, one important piece is missing: a low-cost WDM laser source. Commercially available WDM lasers are commonly used for telecom WDM transmissions, and are typically implemented using distributed feedback (DFB) laser sources. Such WDM lasers are expensive and typically provide only a single wavelength output. Moreover, a multi-wavelength DFB laser array is very hard to implement because of a number of technical challenges, such as face-induced phase errors and problems in achieving a precise grating period. Also, because thousands of optical channels are potentially required for future interconnection applications, the cost of using conventional WDM laser sources could be prohibitive.

Several different approaches have been used to implement a multi-wavelength comb source. One straightforward approach is to use a multi-wavelength DFB array with a wavelength multiplexer. Other solutions use a single broad-spectrum light emitter to replace the DFB laser array, including super-luminescent diodes, broadband lasers, or mode-locked comb lasers. However, none of these solutions provides a practical, low-cost multi-wavelength WDM laser source due to limitations associated with size, cost, and power. Another approach is to use quantum-dot-based comb lasers, which have shown promising results recently with wavelengths in the O band (1300 nm). (See Gregory L. Wojcik, et al., "A single comb laser source for short reach WDM interconnects," Proceedings of the SPIE, Volume 7230, pp. 72300 M-72300 M-12 (2009). However, such quantum-dot-based comb lasers lack flexibility in achieving a desired wavelength channel with sufficient power for each wavelength. Yet another promising approach is to perform source-originated optical switching utilizing the unique wavelength routing capability of arrayed-waveguide-grating-routers (AWGR). However, a tunable or wavelength comb source with fast wavelength switching capability is necessary for such an approach to be competitive with electrical switching.

Hence, what is needed is a practical technique for implementing a WDM laser source that can provide a tunable laser and/or a wavelength comb source without the problems of the above-described existing techniques.

SUMMARY

The disclosed embodiments provide a laser source comprising a silicon waveguide formed in a silicon layer, and a cascaded array of hybrid distributed feedback (DFB) lasers formed by locating sections of III-V gain material over the silicon waveguide. Each DFB laser in the cascaded array comprises a section of III-V gain material located over the silicon waveguide, wherein the section of III-V gain material includes an active region that generates light, and a Bragg grating located on the silicon waveguide. This Bragg grating has a resonance frequency within a gain bandwidth of the section of III-V material and is transparent to frequencies that differ from the resonance frequency. Moreover, each DFB laser has a hybrid mode that resides partially in the III-V gain material and partially in silicon.

In some embodiments, the Bragg grating comprises a phase-shifted sampled Bragg grating (PSBG).

In some embodiments, during a comb-source mode of operation, all of the DFB lasers in the cascaded array are turned on to provide a comb laser source.

In some embodiments, during a tunable-wavelength mode of operation, a selected DFB laser in the cascaded array of DFB lasers is turned on while other lasers in the cascaded array remain transparent to facilitate fast wavelength tuning.

In some embodiments, during the tunable-wavelength mode of operation, sufficient current is provided to turn on the selected DFB laser, while sufficient current is provided to make the other lasers transparent without turning them on.

In some embodiments, the ends of the sections of III-V gain material include taper structures to smooth the transition of light passing between the silicon waveguide and the sections of III-V gain material.

In some embodiments, the laser source further comprises a second cascaded array of hybrid DFB lasers, which is identical to the cascaded array of DFB lasers. It also includes a set of silicon optical switches, which interconnect the cascaded array of DFB lasers with the second cascaded array of hybrid DFB lasers in a manner that enables a DFB laser in the second cascaded array of DFB lasers to be used in place of a failed DFB laser in the cascaded array of DFB lasers.

In some embodiments, locating the consecutive sections of III-V gain material over the silicon waveguide involves performing a wafer-bonding operation to bond each section of III-V gain material onto the silicon layer that contains the silicon waveguide.

In some embodiments, the Bragg grating is comprised of silicon and silicon dioxide and is formed by etching trenches in the silicon and depositing the silicon dioxide in the trenches.

BRIEF DESCRIPTION OF THE FIGURES

FIG. 2A presents a side view of a hybrid DFB laser in accordance with the disclosed embodiments.

FIG. 2B presents a top view of a hybrid DFB laser in accordance with the disclosed embodiments.

FIG. 3A illustrates a set of hybrid DFB lasers arranged in a linear array in accordance with the disclosed embodiments.

FIG. 3B illustrates a set of hybrid DFB lasers arranged in a multi-row array in accordance with the disclosed embodiments.

FIG. 3C illustrates a set of hybrid DFB lasers arranged in a linear array with a single taper before the first gain section and an single taper after the final gain section and no tapers in between in accordance with the disclosed embodiments.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

DETAILED DESCRIPTION

Figure 1:
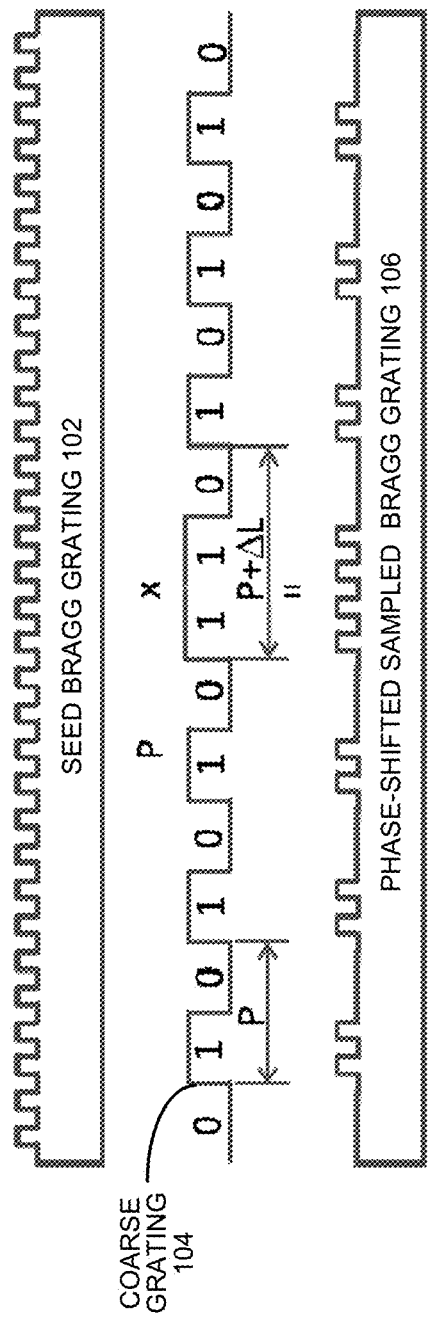
FIG. 1 illustrates the structure of a phase-shifted sampled Bragg grating in accordance with the disclosed embodiments.

A conventional DFB laser uses a Bragg grating with a $\lambda/4$ phase shift in the middle co-integrated on the cladding layer of an active laser waveguide to achieve single longitudinal mode lasing. In such a laser, different lasing wavelengths can be obtained by using gratings with different periods. Moreover, a multi-wavelength source can be built using an array of such DFB lasers with different grating periods. Unfortunately, for a small channel spacing (e.g., 0.8 nm), it is very difficult to realize accuracy and repeatability in practice because the required grating period difference is on the order of 0.2 nm. A better way to achieve accurate channel spacing is to use phase-shifted sampled Bragg gratings. For example, a uniform Bragg grating sampled at a coarse period P with a phase shift in the sampling function, as depicted in FIG. 1, will create an equivalent phase shift $\Delta\phi$ to the odd order resonances of the sampled Bragg grating. (See D. Jiang, X. Chen, Y. Dai, H. Liu, and S. Xie, "A novel distributed feedback fiber laser based on equivalent phase shift," IEEE Photo. Tech. Lett., 16 (12) 2598-2600, 2004.) FIG. 1 illustrates how a fine seed Bragg grating 102 can be used to determine the underlying DBR structure. A coarse grating 104 is superimposed on the seed Bragg grating 102, which results in removal of a number of periods from the seed Bragg grating 102. The end result is a phase-shifted sampled Bragg grating (PSBG) 106 as is illustrated in FIG. 1.

The wavelength spacing $\Delta\lambda$ of the resonant orders of the sampled Bragg grating can be expressed as $$\Delta\lambda = \frac{\lambda_0^2}{2n_g P}, \qquad (1)$$

where $\lambda_0$ is the Bragg wavelength of the seed grating 102, and $n_g$ is the group index of the waveguide. The equivalent phase shift $\Delta\phi$ created by the sampling phase shift $\Delta L$ in the center is given as $$\Delta\phi = \frac{2\pi \Delta L}{P}. \qquad (2)$$

Note that an equivalent quarter-wave phase shift can be generated when $\Delta L$ is half of the sampling period P.

Using this type of equivalent phase-shift, which is induced by a phase-shifted sampled Bragg grating (PSBG), DFB lasers can be implemented using the first order of the sampled grating resonance. (See Y. Shi, X. Chen, Y. Zhou, S. Lin, L. Lu, R. Liu, and Y. Feng, "Experimental demonstration of eight-wavelength distributed feedback semiconductor laser array using equivalent phase shift," Opt. Lett., 37 (16) 3315-3317, 2012.) Due to the fact that the period of the sampling function is much bigger than the seed Bragg grating, both the phase shift and the lasing wavelength can be more precisely controlled. Consequently, low-cost parallel array laser sources can be achieved on III-V with accurate channel spacing using different sample periods.

With a multi-wavelength array laser source, a comb source can be built by simply multiplexing a WDM laser array in parallel or by cascading the array in serial. Unfortunately, fabricating an on-chip multiplexer with low loss requires re-growth of a different band-gap material, while using an off-chip multiplexer located on a different substrate gives rise to integration and coupling challenges. Note that by selecting a proper Bragg wavelength and sampling period, a phase-shifted sampled Bragg grating (PSBG) can be designed with a single resonance frequency within the gain bandwidth of the III-V gain medium, which is transparent to frequencies that differ from the resonance frequency. A WDM comb source can be constructed by cascading an array of such PSBG DFBs. However, it will similarly suffer from the high loss of the interconnect waveguides unless epitaxial re-growth is used for a low-loss passive waveguide material, or the interconnect waveguides are electrically pumped to eliminate the absorption from the active layer.

By applying the PSBG DFB concept to the hybrid III-V/Si platform through heterogeneous integration of III-V material onto silicon-on-insulator (SOI) using wafer bonding, a multi-wavelength comb source with accurate channel spacing can be fabricated without the above-mentioned waveguide loss problem.

As depicted in the conceptual view that appears in FIGS. 2A and 2B, a section of III-V active gain material 210 can be wafer bonded to a silicon wafer 212, which includes a prefabricated silicon waveguide 221 (see FIG. 2B) inside a silicon waveguide layer 207 (see FIG. 2A). The section of III-V active gain material 210 comprises a number of layers, including a P—InP layer 201, a secondary confinement enhancement (SCH) layer 202, an active region 203, and an N—InP layer 205. The silicon wafer 212 comprises a silicon waveguide layer 207, a buried oxide (BOX) layer 208 and a silicon substrate 209.

Note that in the hybrid section, the III-V active gain material sits directly on top of the silicon waveguide 221, resulting a mode partially in III-V and partially in Si. The ratio between III-V material and silicon can be tuned by using different SOI silicon thicknesses and silicon waveguide widths. Moreover, at both ends of the hybrid region, inverse tapers 215 and 216 on the III-V gain material 210 are used to provide a smooth transition of light from the silicon waveguide to/from the III-V/Si hybrid waveguide. A PSBG 206 can be added to the silicon waveguide layer 207 in the hybrid section by etching shallow trenches on the top (as shown in FIG. 2A) or side wall of the silicon waveguide layer 207. In this way, a III-V/Si hybrid DFB laser with accurate lasing wavelength can be implemented with a laser output to the silicon waveguide on both ends.

By cascading an array of III-V/Si hybrid PSBG DFB lasers using PSBGs with different sampling periods in serial as depicted in FIGS. 3A and 3B, a multi-wavelength hybrid silicon laser circuit can be produced. When all of the individual lasers in the array are powered up simultaneously, it can be used as a comb laser source with accurate wavelength spacing. Alternatively, by turning one laser fully on while keeping other lasers at transparency, the III-V/Si hybrid laser circuit can be used as a tunable laser source with discrete wavelengths. Note that the process of turning on a DFB laser can be very fast, which means that this type of discrete wavelength tunable laser circuit can achieve wavelength tuning speeds on the order of a few nanoseconds without mode-hopping. By using the silicon waveguide to interconnect PSBG DFB lasers with different lasing wavelengths, this type of cascaded silicon hybrid laser circuit can be easily configured in a linear array form as shown in FIG. 3A with outputs on both ends of the array, or in the form of a multi-row array with an output on one side of the array using simple silicon waveguide routing as shown in FIG. 3B.

In an alternative embodiment illustrated in FIG. 3C, a linear array of hybrid DFB lasers includes a single taper at the state of the first gain section and a single taper at the end of the final gain section with no tapers in-between.

Figure 4:
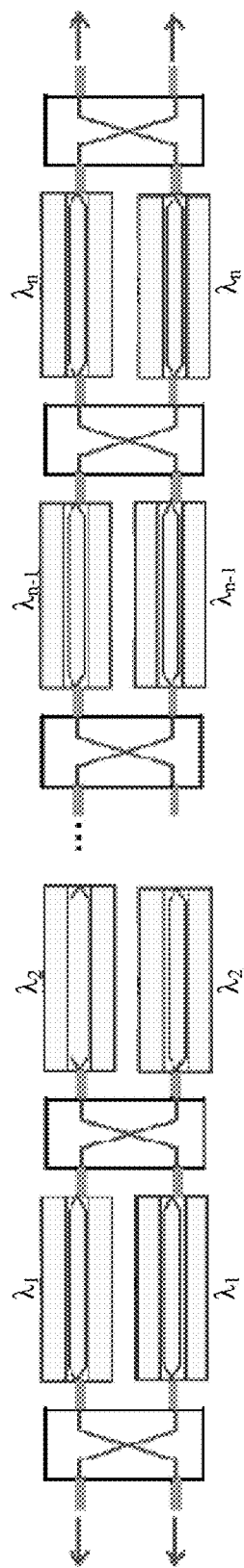
FIG. 4 illustrates an array of DFB lasers that includes switches and additional DFB lasers to provide redundancy in accordance with the disclosed embodiments.

However, this type of serially connected array can suffer from yield problems because a failure in any PSBG DFB laser in the array can cause the entire array to fail. To alleviate this problem, redundancy can be provided using 2×2 silicon optical switches to interconnect two identical III-V/Si hybrid laser arrays to provide improved yield and reliability, as is depicted in FIG. 4.

Modes of Operation

Figure 5:
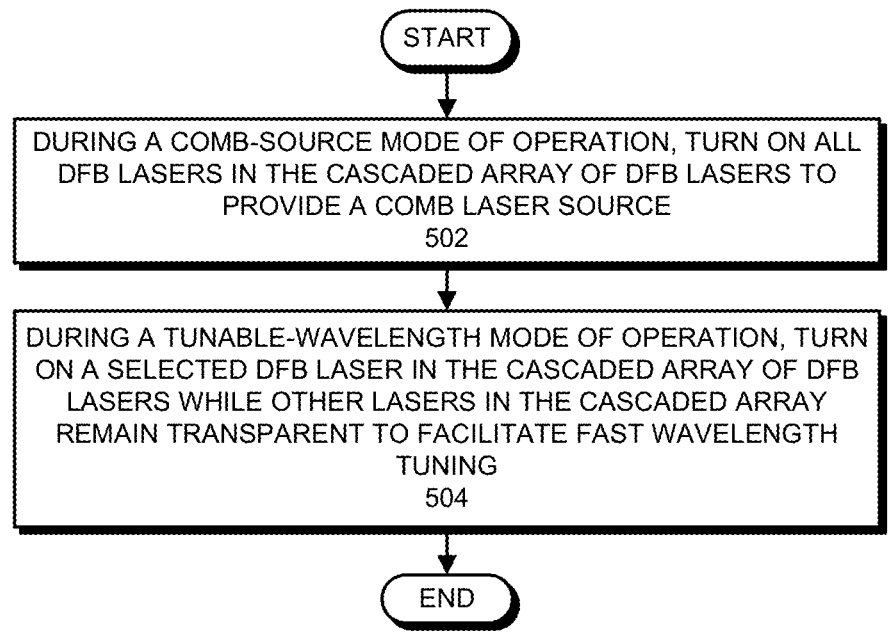
FIG. 5 presents a flow chart illustrating different modes of operation for a cascaded array of DFB lasers in accordance with the disclosed embodiments.

FIG. 5 presents a flow chart illustrating different modes of operation for a cascaded array of DFB lasers in accordance with the disclosed embodiments. During a comb-source mode of operation, the system turns on all DFB lasers in the cascaded array of DFB lasers to provide a comb laser source (step 502). In contrast, during a tunable-wavelength mode of operation, the system turns on a selected DFB laser in the cascaded array of DFB lasers while other lasers in the cascaded array remain transparent to facilitate fast wavelength tuning (step 504). As mentioned above, this can be accomplished by providing sufficient current to turn on the selected DFB laser (e.g., 100 milliamps), while providing sufficient current to make the other lasers transparent without turning them on (e.g., 2 milliamps).

System

Figure 6:
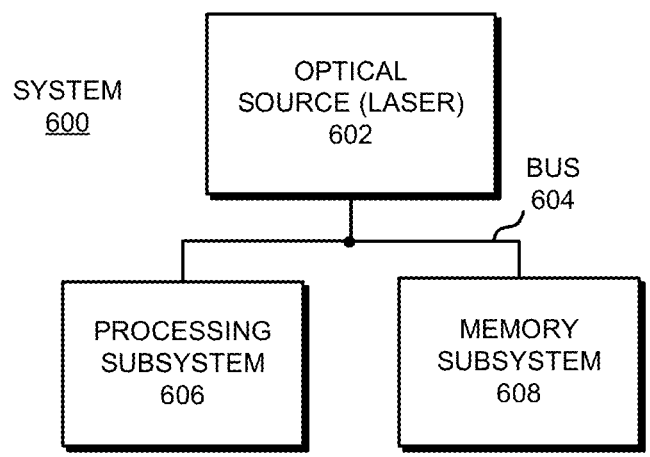
FIG. 6 illustrates a system that includes an optical source, such as a laser, in accordance with an embodiment of the present disclosure.

One or more of the preceding embodiments of the tunable laser may be included in a system or device. More specifically, FIG. 6 illustrates a system 600 that includes an optical source 602, which can be implemented using a laser. System 600 also includes a processing subsystem 606 (with one or more processors) and a memory subsystem 608 (with memory).

In general, components within optical source 602 and system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 602 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A laser source, comprising:
   a silicon waveguide formed in a silicon layer; and
   a cascaded array of hybrid distributed feedback (DFB) lasers formed by locating sections of III-V gain material over the silicon waveguide;
   wherein each DFB laser in the cascaded array comprises,
      a section of III-V gain material located over the silicon waveguide, wherein the section of III-V gain material includes an active region that generates light, and
      a Bragg grating located on the silicon waveguide, wherein the Bragg grating has a resonance frequency within a gain bandwidth of the section of III-V material and is transparent to frequencies that differ from the resonance frequency,
   wherein the DFB laser has a hybrid mode that resides partially in the III-V gain material and partially in silicon.

2. The laser source of claim 1, wherein the Bragg grating comprises a phase-shifted sampled Bragg grating (PSBG).

3. The laser source of claim 1, wherein during a comb-source mode of operation, all of the DFB lasers in the cascaded array are turned on to provide a comb laser source.

4. The laser source of claim 1, wherein during a tunable-wavelength mode of operation, a selected DFB laser in the cascaded array of DFB lasers is turned on while other lasers in the cascaded array remain transparent to facilitate fast wavelength tuning.

5. The laser source of claim 4, wherein during the tunable-wavelength mode of operation, sufficient current is provided to turn on the selected DFB laser, and sufficient current is provided to make the other lasers transparent without turning on the other lasers.

6. The laser source of claim 1, wherein ends of the sections of III-V gain material include taper structures to smooth the transition of light passing between the silicon waveguide and the sections of M-V gain material.

7. The laser source of claim 1, further comprising:
   a second cascaded array of hybrid DFB lasers, which is identical to the cascaded array of DFB lasers; and
   a set of silicon optical switches, which interconnect the cascaded array of DFB lasers with the second cascaded array of hybrid DFB lasers in a manner that enables a DFB laser in the second cascaded array of DFB lasers to be used in place of a failed DFB laser in the cascaded array of DFB lasers.

8. The laser source of claim 1, wherein locating the consecutive sections of M-V gain material over the silicon waveguide involves performing a wafer-bonding operation to bond each section of III-V gain material onto the silicon layer that contains the silicon waveguide.

9. The laser source of claim 1, wherein the Bragg grating is comprised of silicon and silicon dioxide and is formed by etching trenches in the silicon and depositing the silicon dioxide in the trenches.

10. A system, comprising:
    at least one processor;
    at least one memory coupled to the at least one processor; and
    a laser source for communicating optical signals generated by the system, wherein the laser source includes:
       a silicon waveguide formed in a silicon layer; and
       a cascaded array of hybrid distributed feedback (DFB) lasers formed by locating sections of III-V gain material over the silicon waveguide;
       wherein each DFB laser in the cascaded array comprises,
          a section of III-V gain material located over the silicon waveguide, wherein the section of III-V gain material includes an active region that generates light, and
          a Bragg grating located on the silicon waveguide, wherein the Bragg grating has a resonance frequency within a gain bandwidth of the section of III-V material and is transparent to frequencies that differ from the resonance frequency, wherein the DFB laser has a hybrid mode that resides partially in the III-V gain material and partially in silicon.

11. The system of claim 10, wherein the Bragg grating comprises a phase-shifted sampled Bragg grating (PSBG).

12. The system of claim 10, wherein during a comb-source mode of operation, all of the DFB lasers in the cascaded array are turned on to provide a comb laser source.

13. The system of claim 10, wherein during a tunable-wavelength mode of operation, a selected DFB laser in the cascaded array of DFB lasers is turned on while other lasers in the cascaded array remain transparent to facilitate fast wavelength tuning.

14. The system of claim 13, wherein during the tunable-wavelength mode of operation, sufficient current is provided to turn on the selected DFB laser, and sufficient current is provided to make the other lasers transparent without turning on the other lasers.

15. The system of claim 10, wherein ends of the sections of III-V gain material include taper structures to smooth the transition of light passing between the silicon waveguide and the sections of M-V gain material.

16. The system of claim 10, wherein the laser source further comprises:
a second cascaded array of hybrid DFB lasers, which is identical to the cascaded array of DFB lasers; and
a set of silicon optical switches, which interconnect the cascaded array of DFB lasers with the second cascaded array of hybrid DFB lasers in a manner that enables a DFB laser in the second cascaded array of DFB lasers to be used in place of a failed DFB laser in the cascaded array of DFB lasers.

17. The system of claim 10, wherein locating the consecutive sections of III-V gain material over the silicon waveguide involves performing a wafer-bonding operation to bond each section of III-V gain material onto the silicon layer that contains the silicon waveguide.

18. The system of claim 10, wherein the Bragg grating is comprised of silicon and silicon dioxide and is formed by etching trenches in the silicon and depositing the silicon dioxide in the trenches.

19. A method for operating a laser source, comprising:
turning on one or more lasers in a cascaded array of distributed feedback (DFB) lasers, wherein the cascaded array of DFB lasers comprises:
a silicon waveguide formed in a silicon layer; and
the cascaded array of DFB lasers formed by locating sections of III-V gain material over the silicon waveguide;
wherein each DFB laser in the cascaded array comprises,
a section of III-V gain material located over the silicon waveguide, wherein the section of III-V gain material includes an active region that generates light, and
a Bragg grating located on the silicon waveguide, wherein the Bragg grating has a resonance frequency within a gain bandwidth of the section of III-V material and is transparent to frequencies that differ from the resonance frequency,
wherein the DFB laser has a hybrid mode that resides partially in the III-V gain material and partially in silicon.

20. The method of claim 19, wherein the Bragg grating comprises a phase-shifted sampled Bragg grating (PSBG).

* * * * *

UNITED STATES PATENT AND TRADEMARK OFFICE
CERTIFICATE OF CORRECTION

PATENT NO. : 10,170,888 B2
APPLICATION NO. : 15/343080
DATED : January 1, 2019
INVENTOR(S) : Zheng et al.

It is certified that error appears in the above-identified patent and that said Letters Patent is hereby corrected as shown below:

On the Title Page

Column 1, under Assignee, Line 2, delete "Shore," and insert -- Shores, --, therefor.

In the Claims

In Column 8, Line 28, in Claim 6, delete "M-V" and insert -- III-V --, therefor.

In Column 8, Line 39, in Claim 8, delete "M-V" and insert -- III-V --, therefor.

Signed and Sealed this
Seventh Day of January, 2020

Andrei Iancu
*Director of the United States Patent and Trademark Office*